(12) United States Patent
Carpenter et al.

(10) Patent No.: US 11,462,494 B2
(45) Date of Patent: Oct. 4, 2022

(54) SEMICONDUCTOR DEVICE PACKAGE HAVING GALVANIC ISOLATION AND METHOD THEREFOR

(71) Applicant: NXP USA, INC., Austin, TX (US)

(72) Inventors: Burton Jesse Carpenter, Austin, TX (US); Fred T. Brauchler, Canton, MI (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/034,201

(22) Filed: Sep. 28, 2020

(65) Prior Publication Data

US 2022/0102292 A1 Mar. 31, 2022

(51) Int. Cl.
| | |
|---|---|
| *H01L 21/64* | (2006.01) |
| *H01L 23/64* | (2006.01) |
| *H01L 25/065* | (2006.01) |
| *H01L 23/00* | (2006.01) |
| *H01L 23/31* | (2006.01) |
| *H01L 23/367* | (2006.01) |
| *H01L 23/498* | (2006.01) |
| *H01L 21/48* | (2006.01) |
| *H01L 21/56* | (2006.01) |
| *H01L 25/00* | (2006.01) |

(52) U.S. Cl.
CPC ........ *H01L 23/645* (2013.01); *H01L 21/4853* (2013.01); *H01L 21/565* (2013.01); *H01L 23/3128* (2013.01); *H01L 23/367* (2013.01); *H01L 23/49816* (2013.01); *H01L 23/49838* (2013.01); *H01L 24/48* (2013.01); *H01L 25/0655* (2013.01); *H01L 25/50* (2013.01); *H01L 2224/48227* (2013.01); *H01L 2924/19042* (2013.01); *H01L 2924/19103* (2013.01)

(58) Field of Classification Search
CPC .. H01L 23/645; H01L 21/4853; H01L 21/565
See application file for complete search history.

(56) References Cited

U.S. PATENT DOCUMENTS

| | | |
|---|---|---|
| 9,035,422 B2 | 5/2015 | Khanolkar et al. |
| 9,219,028 B1 | 12/2015 | Higgins, III et al. |
| 9,362,987 B2 | 6/2016 | Brauchler et al. |
| 10,446,476 B2 | 10/2019 | Higgins et al. |
| 2011/0254123 A1 | 10/2011 | Sellathamby et al. |

(Continued)

OTHER PUBLICATIONS

U.S. Appl. No. 17/190,542, filed Mar. 3, 2021, and entitled "Semiconductor Device Package Having Galvanic Isolation and Method Therefor".

(Continued)

*Primary Examiner* — Errol V Fernandes

(57) ABSTRACT

A semiconductor device package having galvanic isolation is provided. The semiconductor device package includes a package substrate having a first inductive coil. A first semiconductor die is attached to a first major surface of the package substrate. The first semiconductor die includes a second inductive coil substantially aligned with the first inductive coil. A second semiconductor die is attached to the first major surface of the package substrate. A wireless communication link between the first semiconductor die and the second semiconductor die is formed by way of the first and second inductive coils.

20 Claims, 8 Drawing Sheets

(56) References Cited

U.S. PATENT DOCUMENTS

| | | | |
|---|---|---|---|
| 2012/0168901 A1* | 7/2012 | Santangelo | H01L 23/49575 |
| | | | 257/531 |
| 2015/0115405 A1 | 4/2015 | Wu et al. | |
| 2016/0190052 A1 | 6/2016 | Ruben et al. | |
| 2019/0045623 A1 | 2/2019 | Sutono et al. | |
| 2019/0273066 A1 | 9/2019 | Kuwabara et al. | |
| 2019/0385780 A1* | 12/2019 | Xu | H01F 27/24 |
| 2020/0052393 A1 | 2/2020 | Fang et al. | |
| 2021/0111088 A1* | 4/2021 | Jain | H01L 25/0657 |

OTHER PUBLICATIONS

Non-final office action dated Feb. 10, 2022 in U.S. Appl. No. 17/190,542.

Notice of Allowance dated Jul. 14, 2022 in U.S. Appl. No. 17/190,542.

* cited by examiner

SEMICONDUCTOR DEVICE PACKAGE HAVING GALVANIC ISOLATION AND METHOD THEREFOR

BACKGROUND

Field

This disclosure relates generally to semiconductor device packaging, and more specifically, to a semiconductor device package having galvanic isolation and method of forming the same.

Related Art

Today, there is an increasing trend to include sophisticated semiconductor devices in products and systems that are used every day. These sophisticated semiconductor devices may include wireless communication between integrated circuit (IC) die. In such applications, electrical (or galvanic) isolation is desired between the die. "Galvanic isolation" generally means that there is no direct current (DC) electrically conductive path between distinct circuits. For example, galvanic isolation may be desired to protect a first IC die that operates at a first supply voltage from a second IC die that operates at a second supply voltage different from the first IC die.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device package having galvanic isolation. The packaged semiconductor device includes a first semiconductor die and a second semiconductor die attached to a package substrate. The two semiconductor die are configured to communicate and/or transfer power with one another by way of inductive coils—at least a first coil located on one of the semiconductor die and a second coil located in the package substrate. In this manner, the two semiconductor die are isolated from one another such that if an electrical over stress (EOS) event damaged the first semiconductor die, the second semiconductor die would remain electrically isolated from the first semiconductor die.

Figure 1A:
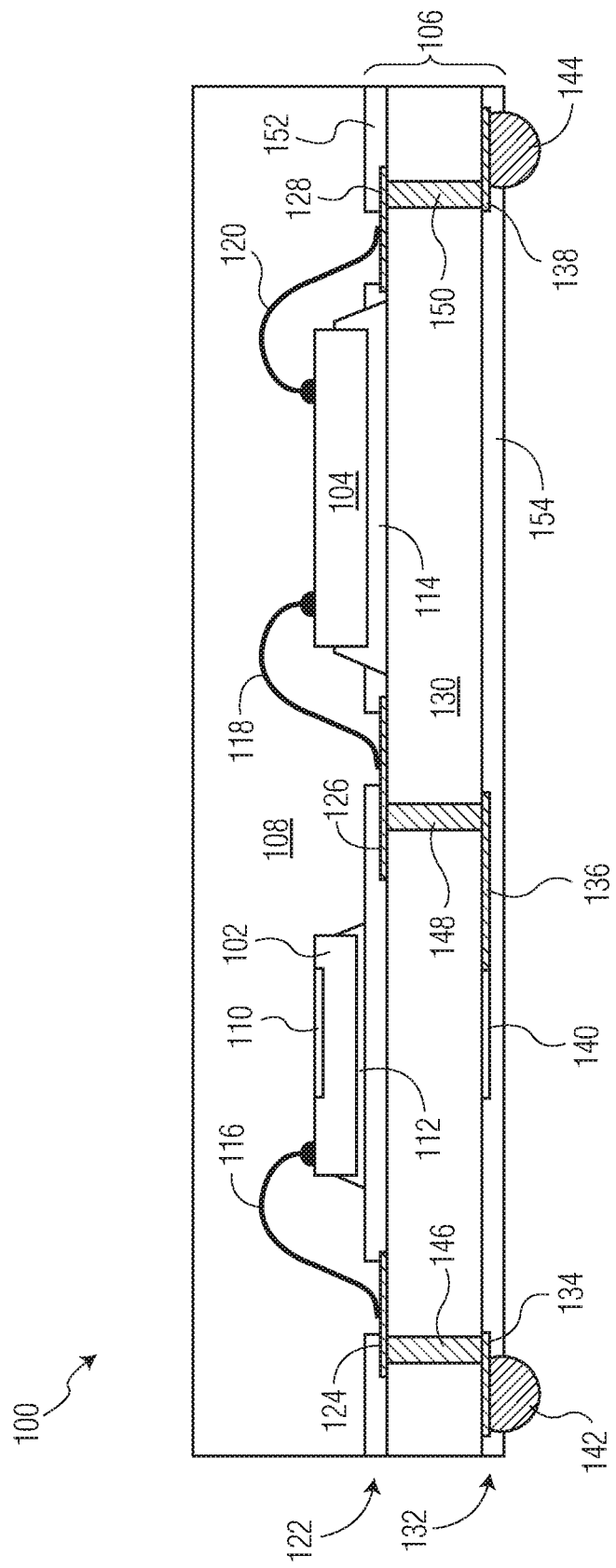
FIG. 1A through FIG. 1C illustrate, in simplified cross-sectional view and corresponding plan views, an example semiconductor device package having galvanic isolation in accordance with an embodiment.
Figure 1B:
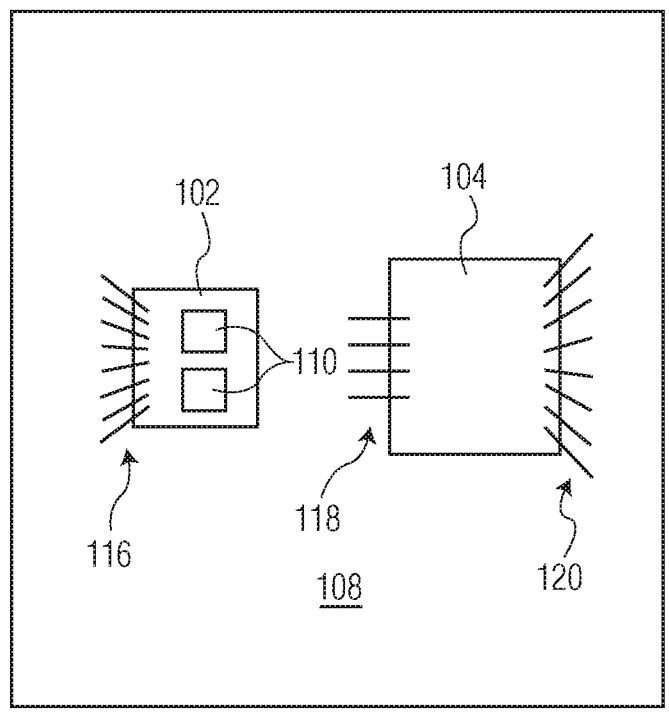
Figure 1C:
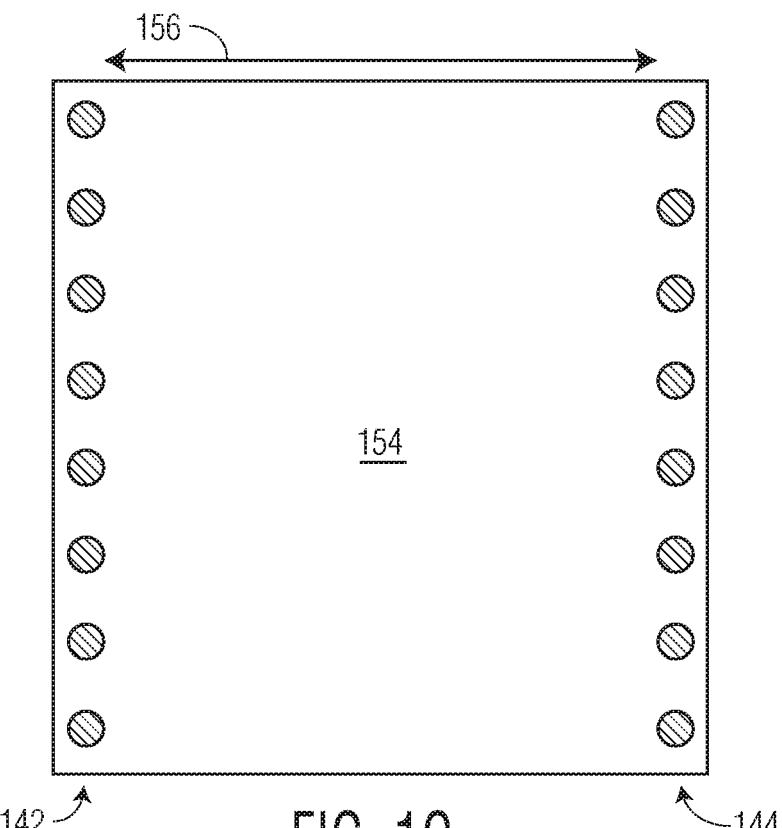

FIG. 1A through FIG. 1C illustrate, in simplified cross-sectional view and corresponding plan views, an example semiconductor device package 100 having galvanic isolation in accordance with an embodiment. In this embodiment, the package 100 includes a first semiconductor die 102 and a second semiconductor die 104 attached to a package substrate 106 and encapsulated with an encapsulant 108. FIG. 1A shows the cross-sectional view of package 100, and the corresponding top side and bottom side plan views of package 100 are depicted in FIG. 1B and FIG. 10 respectively.

The semiconductor die 102 has an active surface (e.g., major surface having circuitry) and a backside surface (e.g., major surface opposite of the active surface). In this embodiment, the backside surface is attached to the package substrate by way of die attach material 112. The semiconductor die 102 includes an inductive coil (e.g., inductor) 110 formed therein and bond pads (not shown) configured for conductive connection to the package substrate 106 by way of bond wires 116, for example. As illustrated, the inductive coil 110 is formed at the active surface of the semiconductor die 102. In some embodiments, the inductive coil 110 may be embedded within the semiconductor die 102 or formed at the backside surface. Note that the semiconductor die 102 may include any number of inductive coils. In the plan view illustration of FIG. 1B, the semiconductor die 102 includes two inductive coils 110, one of which corresponds to the inductive coil 110 depicted in the cross-sectional view illustration of FIG. 1A. The semiconductor die 102 may be formed from any suitable semiconductor material, such as silicon, germanium, gallium arsenide, gallium nitride, silicon carbide, and the like. In this embodiment, the semiconductor die 102 may be characterized as a low voltage die configured to receive and output low voltage signals. The term "low voltage" as used herein generally refers to an operating voltage of approximately 3.3 volts and lower, for example, sufficient for operation of CMOS digital and analog circuitry. The semiconductor die 102 may further include any digital circuits, analog circuits, RF circuits, memory, processor, the like, and combinations thereof. In this embodiment, the semiconductor die 102 may serve as a controller device configured to control functions of the semiconductor die 104, for example.

The semiconductor die 104 has an active surface (e.g., major surface having circuitry) and a backside surface (e.g., major surface opposite of the active surface). In this embodiment, the backside surface is attached to the package substrate by way of die attach material 114. The semiconductor die 104 includes bond pads (not shown) configured for conductive connection to the package substrate 106 by way of bond wires 118 and 120, for example. The semiconductor die 104 may be formed from any suitable semiconductor material, such as silicon, germanium, gallium arsenide, gallium nitride, silicon carbide, and the like. In this embodiment, the semiconductor die 104 may be characterized as a high voltage die configured to receive and/or output high voltage signals (e.g., ~400 volts, ~800 volts). The term "high voltage" as used herein generally refers to an operating voltage of approximately 12.0 volts and higher, for example, sufficient for operation of high voltage circuitry such as insulated-gate bipolar transistors (IGBT). In this embodiment, the semiconductor die 104 is configured to operate in a voltage domain different from the operating voltage domain of the semiconductor die 102.

The package substrate 106 has a first major surface (e.g., top surface) and a second major surface (e.g., bottom surface) opposite of the first major surface. In this embodiment, the package substrate 106 is formed as a multi-layer laminate structure. For example, the package substrate 106 includes a first conductive layer (e.g., metal) 122 located at the first major surface and a second conductive layer 132 located at the second major surface. The conductive layer 122 and the conductive layer 132 are separated by a non-conductive material (e.g., fiber reinforced epoxy material) 130. In this embodiment, the conductive layer 122 is patterned to form conductive traces 124-128 and the conductive layer 132 is patterned to form conductive traces 134-138 and inductive coils 140. The package substrate 106 may include any number of inductive coils 140 configured to form inductive coupling with inductive coils 110. Conductive vias 146-150 are formed to provide conductive connections between the conductive traces 124-128 and the conductive traces 134-138, for example. The inductive coil 140 and the inductive coil 110 are substantially aligned with one another when the semiconductor die 102 is attached to the package substrate 106 to allow for communication by way of inductive coupling.

A first solder mask layer 152 is formed embedding the conductive traces 124-128. Openings formed in the solder mask layer 152 expose portions of the conductive traces 124-128 forming substrate pads to allow for connections to the semiconductor die 102 and 104 by way of respective bond wires 116-120, for example. A second solder mask layer 154 is formed embedding the conductive traces 134-138 and the inductive coils 140. Openings formed in the solder mask layer 154 expose portions of the conductive traces 134 and 138 forming connector pads to allow for connections to a printed circuit board (PCB) by way of respective ball connectors 142 and 144, for example. The ball connectors 142 and 144 may be any suitable conductive structure such as solder ball, gold studs, copper pillars, and the like, to connect conductive features of the package 100 with the PCB. In this embodiment, the package substrate 106 serves as a mechanical carrier, isolation barrier, and external interconnect for package 100.

As depicted in FIG. 1A, the encapsulant 108 (e.g., epoxy molding compound) encapsulates the semiconductor die 102, the semiconductor die 104, the bond wires 116-120, and exposed portions of the top surface of the package substrate 106. For illustration purposes, the top side plan view (FIG. 1B) of the package 100 shows the active surfaces of the semiconductor die 102 and the semiconductor die 104, and portions of bond wires 116-120 revealed through the encapsulant 108. The encapsulated semiconductor die 102 and semiconductor die 104 are separated from one another by a distance sufficient to provide proper isolation. In this embodiment, the semiconductor die 102 and the semiconductor die 104 are separated by a predetermined distance of at least 500 microns to accommodate desired requirements. The bottom side plan view (FIG. 1C) of the package 100 shows an example ball grid array (BGA) of the ball connectors 142 and 144 arranged at the bottom surface of the package substrate 106. A clearance distance is indicated by arrow labeled 156. In this embodiment, the package 100 is configured with a predetermined clearance distance of approximately 8 millimeters to accommodate desired requirements. In other embodiments, it may be desirable to configure the package 100 with other clearance distance values.

In this embodiment, a communication signal path is formed between semiconductor die 102 and semiconductor die 104 by way of the package substrate 106. The signal path is configured to allow communication between the semiconductor die 102 and the semiconductor die 104 while being galvanically isolated from one another. For example, the signal path includes inductive coils 110 and 140 substantially aligned to form an inductive coupling between the semiconductor die 102 and the package substrate 106. The signal path further includes conductive traces 126 and 136, via 148, and bond wire 118 connecting the semiconductor die 104 with the inductive coil 140.

Figure 2A:
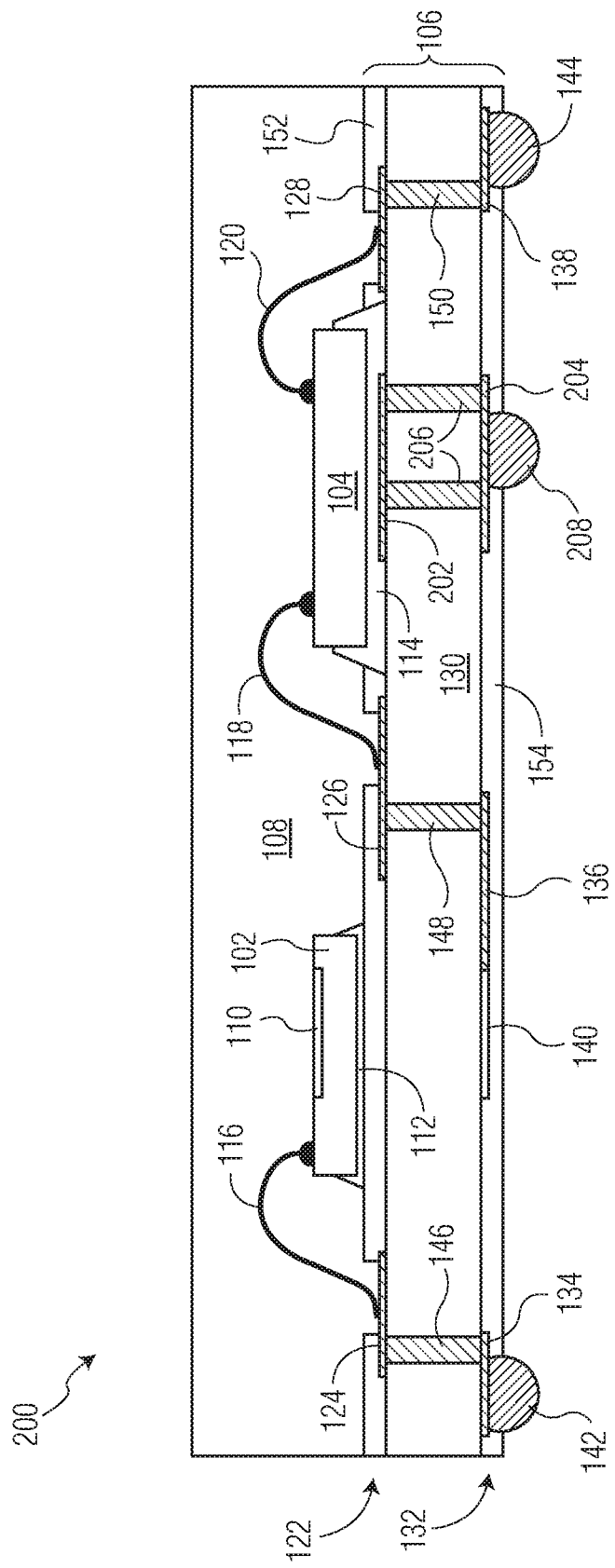
FIG. 2A and FIG. 2B illustrate, in simplified cross-sectional view and corresponding plan view, the example semiconductor device package of FIG. 1 with thermal dissipation structure in accordance with an embodiment.
Figure 2B:
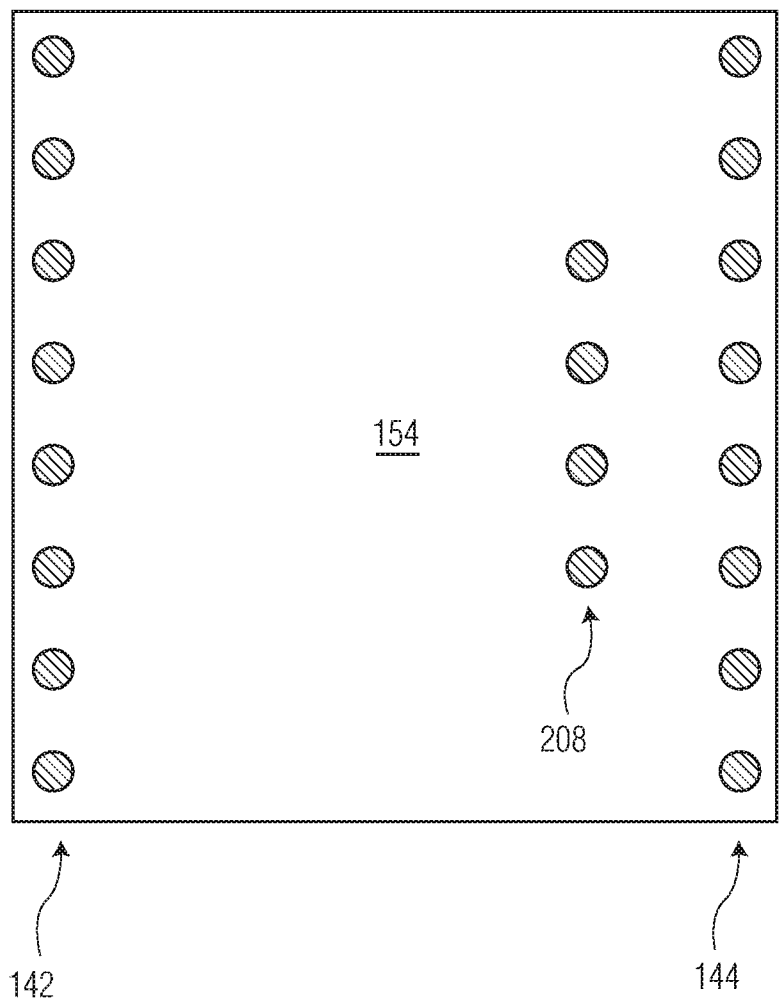

FIG. 2A and FIG. 2B illustrate, in a simplified cross-sectional view and a corresponding plan view, an example semiconductor device package 200 having galvanic isolation in accordance with an embodiment. In this embodiment, the package 200 includes a thermal dissipation structure in addition to the first semiconductor die 102 and the second semiconductor die 104 attached to the package substrate 106 and encapsulated with the encapsulant 108 of package 100 depicted FIG. 1A. In this embodiment, the thermal dissipation structure includes a first conductive trace 202 formed from the conductive layer 122, a second conductive trace 204 formed from the conductive layer 132, and conductive vias 206 formed to provide thermally conductive connections between the conductive traces 202 and 204, for example. The conductive trace 202 may be formed in the shape of a die pad or other suitable shape located below the semiconductor die 104 in a position conducive to dissipating heat generated by semiconductor die 104, for example. Additional openings formed in the solder mask layer 154 expose portions of the conductive traces 204 forming connector pads to allow for connections to the PCB by way of respective ball connectors 208 for further heat dissipation, for example. The bottom side plan view (FIG. 2B) of the package 200 shows an example BGA arrangement including the additional ball connectors 208 affixed at the bottom surface of the package substrate 106.

Figure 3A:
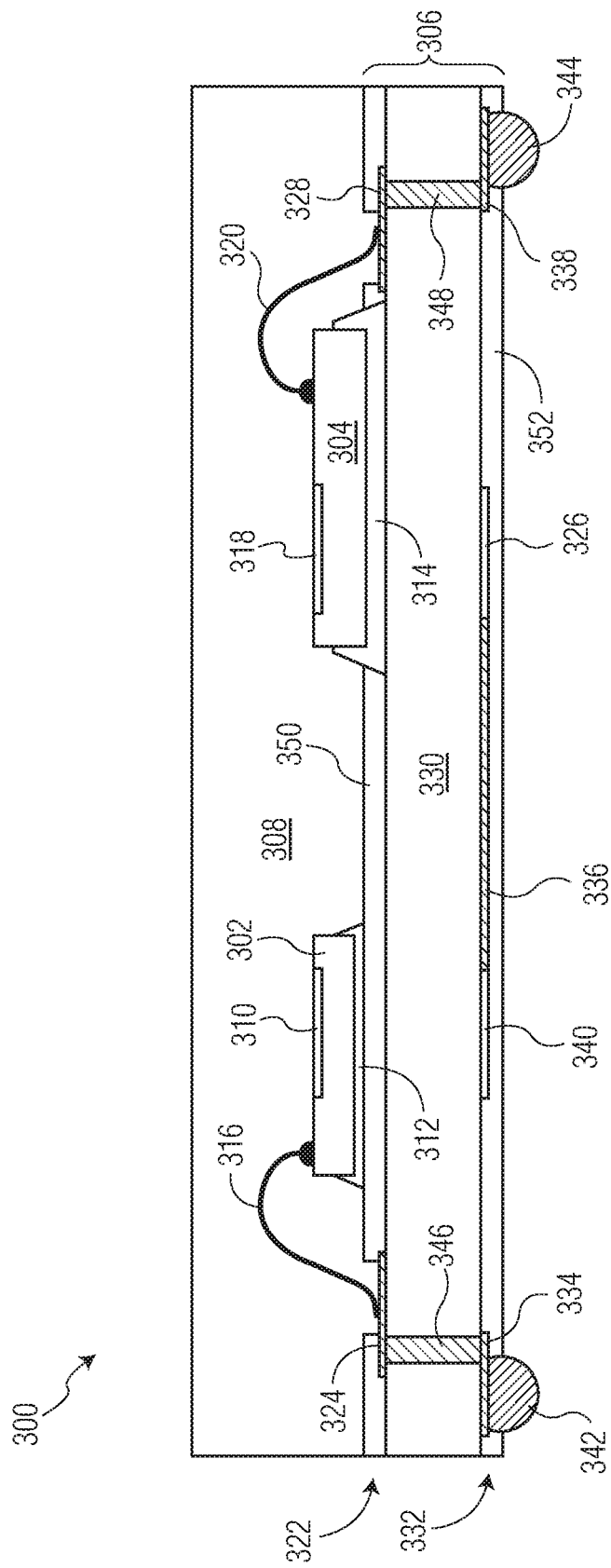
FIG. 3A and FIG. 3B illustrate, in simplified cross-sectional view and corresponding plan view, an alternative example semiconductor device package having galvanic isolation in accordance with an embodiment.
Figure 3B:
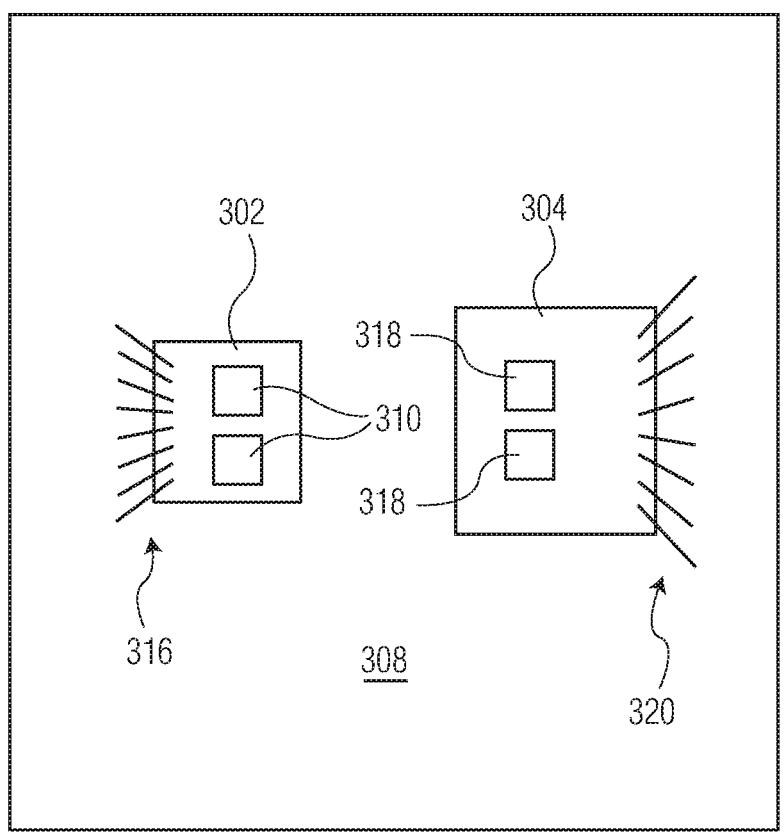

FIG. 3A and FIG. 3B illustrate, in a simplified cross-sectional view and a corresponding plan view, an alternative example semiconductor device package 300 having galvanic isolation in accordance with an embodiment. In this embodiment, the package 300 includes a first semiconductor die 302 and a second semiconductor die 304 attached to a package substrate 306 and encapsulated with an encapsulant 308. FIG. 3A shows the cross-sectional view of package 300, and FIG. 3B shows the corresponding top side plan view including the active surfaces of the semiconductor die 302 and the semiconductor die 304, and portions of bond wires 316 and 320 revealed through the encapsulant 308.

The semiconductor die 302 has an active surface (e.g., major surface having circuitry) and a backside surface (e.g., major surface opposite of the active surface). In this embodiment, the backside surface is attached to the package substrate by way of die attach material 312. The semiconductor die 302 includes an inductive coil (e.g., inductor) 310 formed therein and bond pads (not shown) configured for conductive connection to the package substrate 306 by way of bond wires 316, for example. The inductive coil 310 is formed at the active surface of the semiconductor die 302. In some embodiments, the inductive coil 310 may be embedded within the semiconductor die 302 or formed at the backside surface. The semiconductor die 302 may include any number of inductive coils. In the plan view illustration of FIG. 3B, the semiconductor die 302 includes two inductive coils 310, one of which corresponds to the inductive coil 310 depicted in the cross-sectional view illustration of FIG. 3A. The semiconductor die 302 may be formed from any suitable semiconductor material, such as silicon, germanium, gallium arsenide, gallium nitride, silicon carbide, and the like. In this embodiment, the semiconductor die 302 may be characterized as a low voltage die configured to receive and output low voltage signals. The semiconductor die 302 may further include any digital circuits, analog circuits, RF circuits, memory, processor, the like, and combinations thereof. In this embodiment, the semiconductor die 302 may serve as a controller device configured to control functions of the semiconductor die 304, for example.

The semiconductor die 304 has an active surface and a backside surface. In this embodiment, the backside surface is attached to the package substrate by way of die attach material 314. The semiconductor die 304 includes an inductive coil (e.g., inductor) 318 formed therein and bond pads (not shown) configured for conductive connection to the package substrate 306 by way of bond wires 320, for example. The inductive coil 318 is formed at the active surface of the semiconductor die 304. In some embodiments, the inductive coil 318 may be embedded within the semiconductor die 304 or formed at the backside surface. The semiconductor die 304 may include any number of inductive coils. In the plan view illustration of FIG. 3B, the semiconductor die 304 includes two inductive coils 318, one of which corresponds to the inductive coil 318 depicted in the cross-sectional view illustration of FIG. 3A. The semiconductor die 304 may be formed from any suitable semiconductor material, such as silicon, germanium, gallium arsenide, gallium nitride, silicon carbide, and the like. In this embodiment, the semiconductor die 304 may be characterized as a high voltage die configured to receive and/or output high voltage signals (e.g., ~400 volts, ~800 volts). In this embodiment, the semiconductor die 304 is configured to operate in a voltage domain different from the operating voltage domain of the semiconductor die 302.

The package substrate 306 has a first major surface (e.g., top surface) and a second major surface (e.g., bottom surface) opposite of the first major surface. In this embodiment, the package substrate 306 is formed as a multi-layer laminate structure and serves as a mechanical carrier, isolation barrier, and external interconnect for package 300. For example, the package substrate 306 includes a first conductive layer (e.g., metal) 322 located at the first major surface and a second conductive layer 332 located at the second major surface. The conductive layer 322 and the conductive layer 332 are separated by a non-conductive material (e.g., fiber reinforced epoxy material) 330. In this embodiment, the conductive layer 322 is patterned to form conductive traces 324 and 328 and the conductive layer 332 is patterned to form conductive traces 334-338 and inductive coils 340 and 326. The package substrate 306 may include any number of inductive coils 340 and 326 configured to form inductive coupling with respective inductive coils 310 and 318. Conductive vias 346 and 348 are formed to provide conductive connections between the conductive traces 324 and 328 and respective conductive traces 334 and 338, for example. The inductive coils 340 and 310 are substantially aligned with one another when the semiconductor die 302 is attached to the package substrate 306 to allow for communication by way of inductive coupling. Likewise, the inductive coils 326 and 318 are substantially aligned with one another when the semiconductor die 304 is attached to the package substrate 306 to allow for communication by way of inductive coupling.

A first solder mask layer 350 is formed embedding the conductive traces 324 and 328. Openings formed in the solder mask layer 350 expose portions of the conductive traces 324 and 328 forming substrate pads to allow for connections to the semiconductor die 302 and 304 by way of respective bond wires 316 and 320, for example. A second solder mask layer 352 is formed embedding the conductive traces 334-338 and the inductive coils 340 and 326. Openings formed in the solder mask layer 352 expose portions of the conductive traces 334 and 338 forming connector pads to allow for connections to a PCB by way of respective ball connectors 342 and 344, for example.

In this embodiment, a communication signal path is formed between semiconductor die 302 and semiconductor die 304 by way of the package substrate 306. The signal path is configured to allow communication between the semiconductor die 302 and the semiconductor die 304 while being galvanically isolated from one another. For example, the signal path includes a first set of inductive coils 310 and 340 substantially aligned to form a first inductive coupling between the semiconductor die 302 and the package substrate 306. The signal path further includes a second set of inductive coils 318 and 326 substantially aligned to form a second inductive coupling between the semiconductor die 304 and the package substrate 306. Conductive trace 336 interconnects inductive coils 340 and 326 thus forming a series connection of the first set of inductive coils with the second set of inductive coils coupled between the semiconductor die 302 and the semiconductor die 304.

Figure 4A:
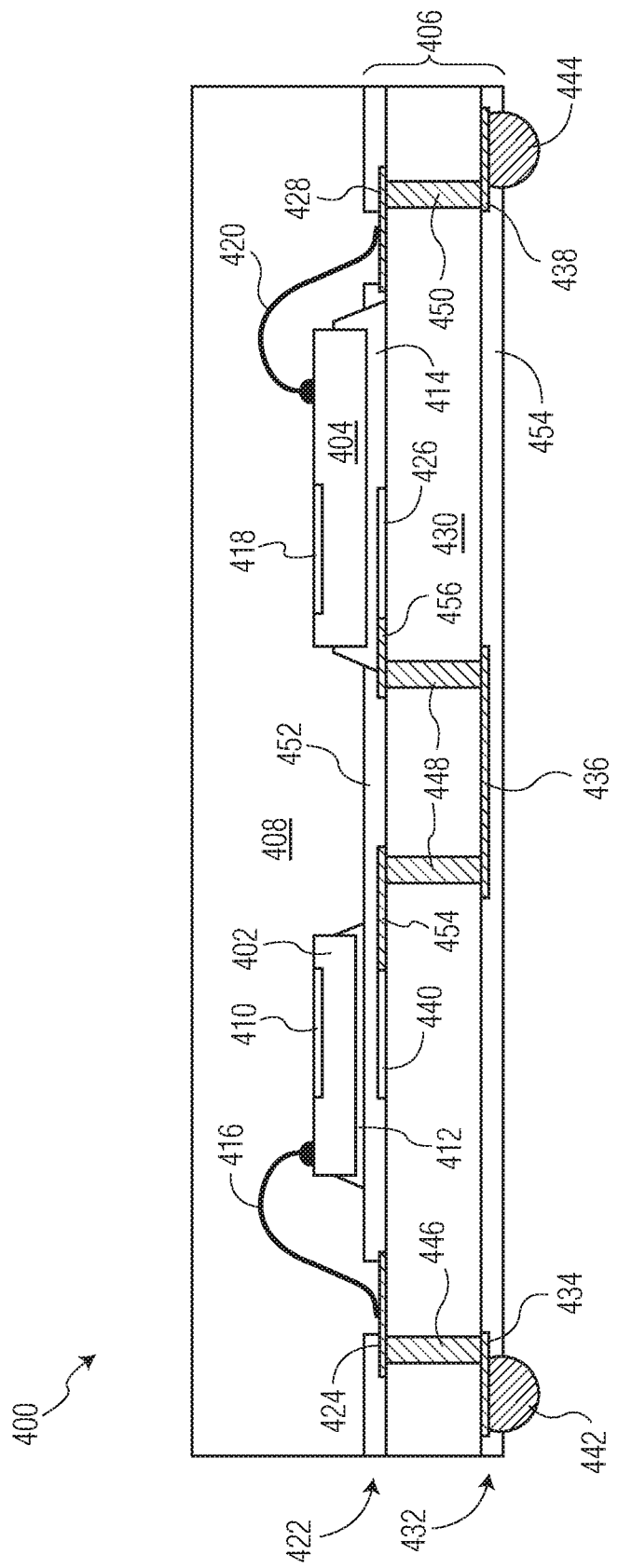
FIG. 4A and FIG. 4B illustrate, in simplified cross-sectional view and corresponding plan view, an alternative example semiconductor device package having galvanic isolation in accordance with an embodiment.
Figure 4B:
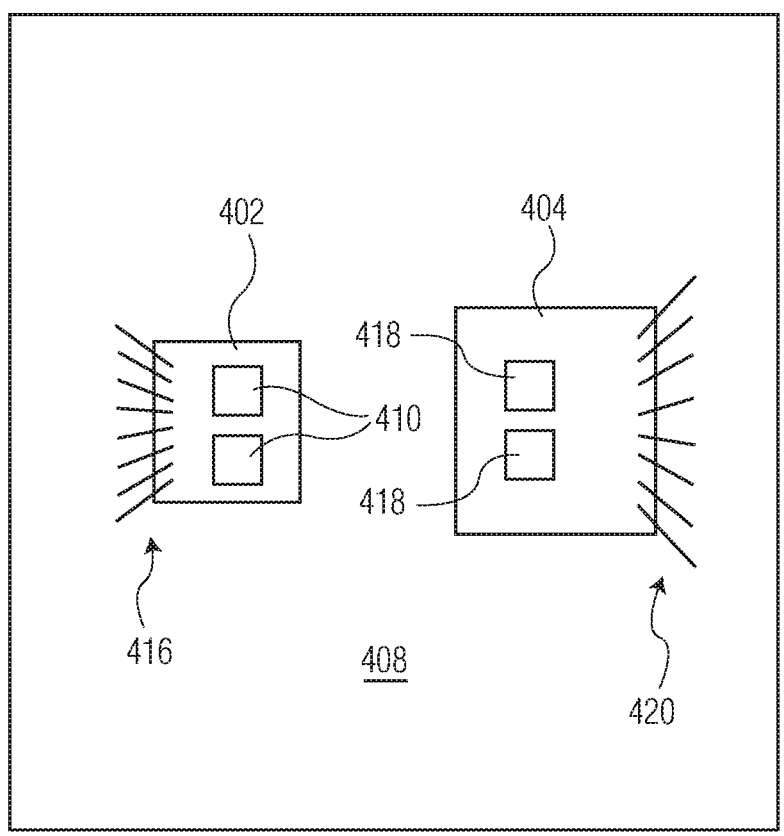

FIG. 4A and FIG. 4B illustrate, in a simplified cross-sectional view and a corresponding plan view, an alternative example semiconductor device package 400 having galvanic isolation in accordance with an embodiment. In this embodiment, the package 400 includes a first semiconductor die 402 and a second semiconductor die 404 attached to a package substrate 406 and encapsulated with an encapsulant 408. FIG. 4A shows the cross-sectional view of package 400, and FIG. 4B shows the corresponding top side plan view including the active surfaces of the semiconductor die 402 and the semiconductor die 404, and portions of bond wires 416 and 420 revealed through the encapsulant 408.

The semiconductor die 402 has an active surface (e.g., major surface having circuitry) and a backside surface (e.g., major surface opposite of the active surface). In this embodiment, the backside surface is attached to the package substrate by way of die attach material 412. The semiconductor die 402 includes an inductive coil (e.g., inductor) 410 formed therein and bond pads (not shown) configured for conductive connection to the package substrate 406 by way of bond wires 416, for example. The inductive coil 410 is formed at the active surface of the semiconductor die 402. In some embodiments, the inductive coil 410 may be embedded within the semiconductor die 402 or formed at the backside surface. The semiconductor die 402 may include any number of inductive coils. In the plan view illustration of FIG. 4B, the semiconductor die 402 includes two inductive coils 410, one of which corresponds to the inductive coil 410 depicted in the cross-sectional view illustration of FIG. 4A. The semiconductor die 402 may be formed from any suitable semiconductor material, such as silicon, germanium, gallium arsenide, gallium nitride, silicon carbide, and the like. In this embodiment, the semiconductor die 402 may be characterized as a low voltage die configured to receive and output low voltage signals. The semiconductor die 402 may further include any digital circuits, analog circuits, RF circuits, memory, processor, the like, and combinations thereof. In this embodiment, the semiconductor die 402 may serve as a controller device configured to control functions of the semiconductor die 404, for example.

The semiconductor die 404 has an active surface and a backside surface. In this embodiment, the backside surface is attached to the package substrate by way of die attach material 414. The semiconductor die 404 includes an inductive coil (e.g., inductor) 418 formed therein and bond pads (not shown) configured for conductive connection to the package substrate 406 by way of bond wires 420, for example. The inductive coil 418 is formed at the active surface of the semiconductor die 404. In some embodiments, the inductive coil 418 may be embedded within the semiconductor die 404 or formed at the backside surface. The semiconductor die 404 may include any number of inductive coils. In the plan view illustration of FIG. 4B, the semiconductor die 404 includes two inductive coils 418, one of which corresponds to the inductive coil 418 depicted in the cross-sectional view illustration of FIG. 4A. The semiconductor die 404 may be formed from any suitable semiconductor material, such as silicon, germanium, gallium arsenide, gallium nitride, silicon carbide, and the like. In this embodiment, the semiconductor die 404 may be characterized as a high voltage die configured to receive and/or output high voltage signals (e.g., ~400 volts, ~800 volts). In this embodiment, the semiconductor die 404 is configured to operate in a voltage domain different from the operating voltage domain of the semiconductor die 402.

The package substrate 406 has a first major surface (e.g., top surface) and a second major surface (e.g., bottom surface) opposite of the first major surface. In this embodiment, the package substrate 406 is formed as a multi-layer laminate structure and serves as a mechanical carrier, isolation barrier, and external interconnect for package 400. For example, the package substrate 406 includes a first conductive layer (e.g., metal) 422 located at the first major surface and a second conductive layer 432 located at the second major surface. The conductive layer 422 and the conductive layer 432 are separated by a non-conductive material (e.g., fiber reinforced epoxy material) 430. In this embodiment, the conductive layer 422 is patterned to form conductive traces 424, 428, 454, 456, and inductive coils 440 and 426, and the conductive layer 432 is patterned to form conductive traces 434-438. The package substrate 406 may include any number of inductive coils 440 and 426 configured to form inductive coupling with respective inductive coils 410 and 418. Conductive vias 446-450 are formed to provide conductive connections between the conductive traces 424, 428, 454, 456 at the top surface and respective conductive traces 434-438 at the bottom surface, for example. The inductive coils 440 and 410 are substantially aligned with one another when the semiconductor die 402 is attached to the package substrate 406 to allow for communication by way of inductive coupling. Likewise, the inductive coils 426 and 418 are substantially aligned with one another when the semiconductor die 404 is attached to the package substrate 406 to allow for communication by way of inductive coupling.

A first solder mask layer 452 is formed embedding the conductive traces 424, 428, 454, 456, and inductive coils 440 and 426. Openings formed in the solder mask layer 452 expose portions of the conductive traces 424 and 428 forming substrate pads to allow for connections to the semiconductor die 402 and 404 by way of respective bond wires 416 and 420, for example. A second solder mask layer 454 is formed embedding the conductive traces 434-438. Openings formed in the solder mask layer 454 expose portions of the conductive traces 434 and 438 forming connector pads to allow for connections to a PCB by way of respective ball connectors 442 and 444, for example.

In this embodiment, a communication signal path is formed between semiconductor die 402 and semiconductor die 404 by way of the package substrate 406. The signal path is configured to allow communication between the semiconductor die 402 and the semiconductor die 404 while being galvanically isolated from one another. For example, the signal path includes a first set of inductive coils 410 and 440 substantially aligned to form a first inductive coupling between the semiconductor die 402 and the package substrate 406. The signal path further includes a second set of inductive coils 418 and 426 substantially aligned to form a second inductive coupling between the semiconductor die 404 and the package substrate 406. Conductive traces 436, 454-456 and vias 448 interconnect inductive coils 440 and 426 thus forming a series connection of the first set of inductive coils with the second set of inductive coils coupled between the semiconductor die 402 and the semiconductor die 404.

Generally, there is provided, a semiconductor device package including a package substrate having a first inductive coil; a first semiconductor die attached to a first major surface of the package substrate, the first semiconductor die having a second inductive coil substantially aligned with the first inductive coil; and a second semiconductor die attached to the first major surface of the package substrate, a first wireless communication link between the first semiconductor die and the second semiconductor die formed by way of the first and second inductive coils. The first inductive coil may be formed from a conductive layer of the package substrate, the conductive layer embedded in the package substrate. The second semiconductor die may be conductively interconnected to the first inductive coil. The semiconductor device package may further include ball connectors attached to the package substrate, the ball connectors configured to connect the semiconductor device package to a printed circuit board (PCB). A first subset of the ball connectors conductively connected to the first semiconductor die may be separated from a second subset of the ball connectors conductively connected to the second semiconductor die by a first distance, the first distance characterized as a clearance distance configured for high voltage isolation. The package substrate may further include a thermal dissipation structure located below the second semiconductor die, the thermal dissipation structure configured and arranged to dissipate heat generated by the second semiconductor die. The package substrate may further include a third inductive coil conductively connected to the first inductive coil, the second semiconductor die located over the third inductive coil. The first inductive coil and the third inductive coil may be formed from a same conductive layer of the package substrate. The second semiconductor die may further include a fourth inductive coil aligned with the third inductive coil, a second wireless communication link between the first semiconductor die and the second semiconductor die formed by way of the third and fourth inductive coils.

In another embodiment, there is provided, a method of manufacturing a semiconductor device including providing a package substrate having a first inductive coil; attaching a first semiconductor die to a first major surface of the package substrate, the first semiconductor die having a second inductive coil substantially aligned with the first inductive coil; attaching a second semiconductor die to the first major surface of the package substrate; and forming a first wireless communication link between the first semiconductor die and the second semiconductor die including the first and second inductive coils. The package substrate may further include forming the first inductive coil from a conductive layer embedded in the package substrate. The method may further include attaching a bond wire to form a conductive connection between the second semiconductor die and a substrate pad formed at the first major surface of the package substrate. The package substrate may further include a conductive path formed between the substrate pad and the first inductive coil. The method may further include encapsulating the first semiconductor die, the second semiconductor die, and portions of the package substrate with an epoxy encapsulant. The package substrate may further include a third inductive coil conductively connected to the first inductive coil, the second semiconductor die located over the third inductive coil. The second semiconductor die may further include a fourth inductive coil substantially aligned with the third inductive coil, forming a second wireless communication link between the first semiconductor die and the second semiconductor die by way of the third and fourth inductive coils.

In yet another embodiment, there is provided, a semiconductor device package including a package substrate having a first inductive coil; a first semiconductor die attached to a first major surface of the package substrate, the first semiconductor die having a second inductive coil substantially aligned with the first inductive coil; and a second semiconductor die attached to the first major surface of the package substrate, the first semiconductor die configured to communicate with the second semiconductor die by way of the first and second inductive coils. The semiconductor device package may further include a conductive path formed between the second semiconductor die and the first inductive coil. The first inductive coil may be formed from a conductive layer at a second major surface of the package substrate. The first semiconductor die may be characterized as a low voltage die and the second semiconductor die may be characterized as a high voltage die.

By now, it should be appreciated that there has been provided a semiconductor device package having galvanic isolation. The packaged semiconductor device includes a first semiconductor die and a second semiconductor die attached to a package substrate. The two semiconductor die are configured to communicate and/or transfer power with one another by way of inductive coils—at least a first coil located on one of the semiconductor die and a second coil located in the package substrate. In this manner, the two semiconductor die are isolated from one another such that if an EOS event damaged the first semiconductor die, the second semiconductor die would remain electrically isolated from the first semiconductor die.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a package substrate having a first inductive coil;
   a first semiconductor die attached to a first major surface of the package substrate, the first semiconductor die having a second inductive coil substantially aligned with the first inductive coil; and
   a second semiconductor die attached to the first major surface of the package substrate, a first wireless communication link between the first semiconductor die and the second semiconductor die formed by way of the first and second inductive coils;
   wherein the second semiconductor die is conductively interconnected to the first inductive coil.

2. The semiconductor device package of claim 1, wherein the first inductive coil is formed from a conductive layer of the package substrate, the conductive layer embedded in the package substrate.

3. The semiconductor device package of claim 1, further comprising ball connectors attached to the package substrate, the ball connectors configured to connect the semiconductor device package to a printed circuit board (PCB).

4. The semiconductor device package of claim 3, wherein a first subset of the ball connectors conductively connected to the first semiconductor die is separated from a second subset of the ball connectors conductively connected to the second semiconductor die by a first distance, the first distance characterized as a clearance distance configured for high voltage isolation.

5. The semiconductor device package of claim 1, wherein the package substrate further comprises a thermal dissipation structure located below the second semiconductor die, the thermal dissipation structure configured and arranged to dissipate heat generated by the second semiconductor die.

6. The semiconductor device package of claim 1, wherein the package substrate further comprises a third inductive coil conductively connected to the first inductive coil, the second semiconductor die located over the third inductive coil.

7. The semiconductor device package of claim 6, wherein the first inductive coil and the third inductive coil are formed from a same conductive layer of the package substrate.

8. The semiconductor device package of claim 6, wherein the second semiconductor die further comprises a fourth inductive coil aligned with the third inductive coil, a second wireless communication link between the first semiconductor die and the second semiconductor die formed by way of the third and fourth inductive coils.

9. A method of manufacturing a semiconductor device, the method comprising:
   providing a package substrate having a first inductive coil;
   attaching a first semiconductor die to a first major surface of the package substrate, the first semiconductor die having a second inductive coil substantially aligned with the first inductive coil;

attaching a second semiconductor die to the first major surface of the package substrate, the second semiconductor die conductively interconnected to the first inductive coil; and forming a first wireless communication link between the first semiconductor die and the second semiconductor die including the first and second inductive coils.

10. The method of claim 9, wherein the package substrate further comprises forming the first inductive coil from a conductive layer embedded in the package substrate.

11. The method of claim 9, further comprising attaching a bond wire to form a conductive connection between the second semiconductor die and a substrate pad formed at the first major surface of the package substrate.

12. The method of claim 11, wherein the package substrate further includes a conductive path formed between the substrate pad and the first inductive coil.

13. The method of claim 9, further comprising encapsulating the first semiconductor die, the second semiconductor die, and portions of the package substrate with an epoxy encapsulant.

14. The method of claim 9, wherein the package substrate further includes a third inductive coil conductively connected to the first inductive coil, the second semiconductor die located over the third inductive coil.

15. The method of claim 14, wherein the second semiconductor die further includes a fourth inductive coil substantially aligned with the third inductive coil, and further comprising forming a second wireless communication link between the first semiconductor die and the second semiconductor die by way of the third and fourth inductive coils.

16. A semiconductor device package comprising:
a package substrate having a first inductive coil;
a first semiconductor die attached to a first major surface of the package substrate, the first semiconductor die having a second inductive coil substantially aligned with the first inductive coil; and
a second semiconductor die attached to the first major surface of the package substrate, the first semiconductor die configured to wirelessly communicate with the second semiconductor die by way of the first and second inductive coils;
wherein the second semiconductor die is conductively interconnected to the first inductive coil.

17. The semiconductor device package of claim 16, further comprising a bond wire attached between the second semiconductor die and the package substrate to form a conductive path between the second semiconductor die and the first inductive coil.

18. The semiconductor device package of claim 16, wherein the first inductive coil is formed from a conductive layer at a second major surface of the package substrate.

19. The semiconductor device package of claim 16, wherein the first semiconductor die is characterized as a low voltage die and the second semiconductor die is characterized as a high voltage die.

20. The semiconductor device package of claim 16, wherein the package substrate further comprises a third inductive coil conductively connected to the first inductive coil, the second semiconductor die located over the third inductive coil.

* * * * *